US012656680B2

(12) United States Patent
Haga et al.

(10) Patent No.: US 12,656,680 B2
(45) Date of Patent: Jun. 16, 2026

(54) METALLIZATION METHOD

(71) Applicant: Rohm and Haas Electronic Materials LLC, Marlborough, MA (US)

(72) Inventors: Mitsuru Haga, Niigata (JP); Cong Liu, Shrewsbury, MA (US); James F. Cameron, Brookline, MA (US)

(73) Assignees: DUPONT ELECTRONIC MATERIALS INTERNATIONAL, LLC, Marlborough, MA (US); ROHM AND HAAS ELECTRONIC MATERIALS KK, Tokyo (JP)

( * ) Notice: Subject to any disclaimer, the term of this patent is extended or adjusted under 35 U.S.C. 154(b) by 277 days.

(21) Appl. No.: 18/226,481

(22) Filed: Jul. 26, 2023

(65) Prior Publication Data

US 2024/0055382 A1 Feb. 15, 2024

Related U.S. Application Data

(60) Provisional application No. 63/392,275, filed on Jul. 26, 2022.

(51) Int. Cl.
*G03F 7/004* (2006.01)
*C08F 212/14* (2006.01)
(Continued)

(52) U.S. Cl.
CPC .......... *G03F 7/0045* (2013.01); *C08F 212/24* (2020.02); *G03F 7/038* (2013.01);
(Continued)

(58) Field of Classification Search
CPC .. H01L 24/11; H01L 21/28506; C08F 212/24; C08F 2/50; G03F 7/0045;
(Continued)

(56) References Cited

U.S. PATENT DOCUMENTS 6,340,553 B1 1/2002 Oomori et al.
6,387,587 B1 5/2002 Oomori et al.
(Continued)

FOREIGN PATENT DOCUMENTS

JP 2002062655 A 2/2002
JP 2002062656 A 2/2002
(Continued)

OTHER PUBLICATIONS

Bardecker et al. "Self-assembled Electroactive Phosphonic Acids on ITO: Maximizing Hole-Injection in Polymer Light-Emitting Diodes" Advanced Functional Materials 18.24 (Dec. 2008): pp. 3964-3971.
(Continued)

*Primary Examiner* — S M Sohel Imtiaz

(74) *Attorney, Agent, or Firm* — CANTOR COLBURN LLP

(57) ABSTRACT

Disclosed herein is a metallization method, comprising (a) providing a photoresist layer on a first surface of a substrate, wherein the photoresist layer is formed from a photoresist composition comprising: a polymer comprising acid-labile groups; a photoacid generator; an organic phosphonic acid; and a solvent; (b) pattern-wise exposing the photoresist layer to activating radiation; (c) developing the exposed photoresist layer with a basic developer to form a photoresist pattern; and (d) after forming the photoresist pattern, plating a metal on the first surface of the substrate using the photoresist pattern as a plating mask.

11 Claims, 11 Drawing Sheets

(51) Int. Cl.
*G03F 7/038* (2006.01)
*G03F 7/039* (2006.01)
*H10W 72/00* (2026.01)

(52) U.S. Cl.
CPC ....... *G03F 7/039* (2013.01); *H10W 72/01235* (2026.01); *H10W 72/01255* (2026.01)

(58) Field of Classification Search
CPC . G03F 7/038; G03F 7/039; G03F 7/40; G03F 7/405; C09D 125/18; C23C 14/042; C23C 14/14; C23C 16/042; C23C 16/06
See application file for complete search history.

(56) References Cited

U.S. PATENT DOCUMENTS

| | | | | |
|---|---|---|---|---|
| 6,485,887 | B2 | 11/2002 | Oomori et al. | |
| 6,630,282 | B2 | 10/2003 | Oomori et al. | |
| 6,773,863 | B2 | 8/2004 | Oomori et al. | |
| 6,777,158 | B2 | 8/2004 | Maemori et al. | |
| 6,815,144 | B2 | 11/2004 | Oomori et al. | |
| 6,818,380 | B2 | 11/2004 | Maemori et al. | |
| 6,869,745 | B2 | 3/2005 | Oomori et al. | |
| 6,890,697 | B2 | 5/2005 | Oomori et al. | |
| 7,147,984 | B2 | 12/2006 | Yukawa et al. | |
| 2002/0028407 | A1 | 3/2002 | Oomori et al. | |
| 2002/0031722 | A1 | 3/2002 | Oomori et al. | |
| 2002/0034704 | A1 | 3/2002 | Oomori et al. | |
| 2002/0045133 | A1 | 4/2002 | Maemori et al. | |
| 2002/0090570 | A1 | 7/2002 | Oomori et al. | |
| 2002/0090571 | A1 | 7/2002 | Oomori et al. | |
| 2002/0094489 | A1 | 7/2002 | Oomori et al. | |
| 2002/0119393 | A1 | 8/2002 | Yukawa et al. | |
| 2003/0152865 | A1 | 8/2003 | Oomori et al. | |
| 2004/0023163 | A1 | 2/2004 | Yukawa et al. | |
| 2004/0067615 | A1 | 4/2004 | Maemori et al. | |
| 2004/0191677 | A1 | 9/2004 | Yukawa et al. | |
| 2005/0042544 | A1 | 2/2005 | Oomori et al. | |
| 2005/0158655 | A1* | 7/2005 | Lamanna | G03F 7/038 430/281.1 |
| 2010/0216071 | A1* | 8/2010 | Goldfarb | C08F 220/22 430/326 |
| 2010/0266966 | A1* | 10/2010 | Park | G03F 7/0048 430/323 |
| 2011/0129781 | A1* | 6/2011 | Kim | G03F 7/0045 430/323 |
| 2015/0086924 | A1* | 3/2015 | Wu | H01L 21/32139 430/270.1 |
| 2018/0286797 | A1* | 10/2018 | Goh | H01L 21/486 |
| 2021/0074620 | A1* | 3/2021 | Swan | G03F 1/38 |
| 2021/0181629 | A1* | 6/2021 | Haga | C08K 5/3435 |
| 2022/0348698 | A1 | 11/2022 | Omatsu et al. | |
| 2023/0395492 | A1* | 12/2023 | Lai | H01L 23/3128 |
| 2024/0371638 | A1* | 11/2024 | Weng | G03F 7/11 |

FOREIGN PATENT DOCUMENTS

| | | | |
|---|---|---|---|
| JP | 2004309776 | A | 11/2004 |
| JP | 4318944 | B2 | 8/2009 |
| JP | 4318945 | B2 | 8/2009 |
| KR | 20140067904 | A | 6/2014 |
| TW | 201409176 | A | 3/2014 |

OTHER PUBLICATIONS

Huang et al. "Intermetallic formation of copper pillar with Sn—Ag—Cu for flip-chip-on-module packaging" IEEE Transactions on Components and Packaging Technologies 31.4 (Nov. 2008): pp. 767-775.

Luo et al. "Method to improve the process efficiency for copper pillar electroplating" Journal of The Electrochemical Society 163.3 (Dec. 2015): E39-E42.

Nair et al. "Sputtered Ti—Cu as a superior barrier and seed layer for panel-based high-density RDL wiring structures" 2015 IEEE 65th electronic components and technology conference (ECTC). IEEE (May 2015) pp. 2248-2253.

Onozeki et al. "Study of fine pitch RDL first FO-PLP/WLP" 2018 International Wafer Level Packaging Conference (IWLPC). IEEE, Oct. 2018 pp. 1-7.

Reinhardt "9.3.6 Copper-Passivating Agents" in Handbook of Silicon Wafer Cleaning Technology (2nd Edition), William Andrew Publishing., 2008, pp. 588-598.

* cited by examiner

| Examples | CF-2 | EX-1 | CF-1 |
|---|---|---|---|
| Base | Troger's Base | Troger's Base | Troger's Base |
| Base (pbw*) | 0.217 | 0.158 | 0.158 |
| Additives (ppw*) | None | C1<br>0.073<br>pKa=1.88 | C4<br>0.064<br>pKa=3.01 |
| Acid/BASE (mol/mol) | 0 | 0.73 | 0.73 |
| Exposure energy (mJ/cm²) | 110 | 95 | 99 |
| Cross section profile 1.5μm dense trenches | 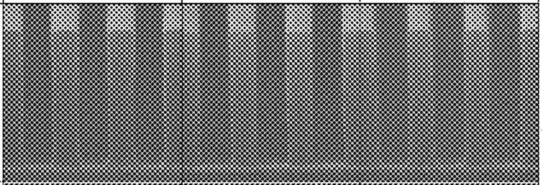 | | |
| Cross section profile at the bottom of 1.5μm isolated trench | 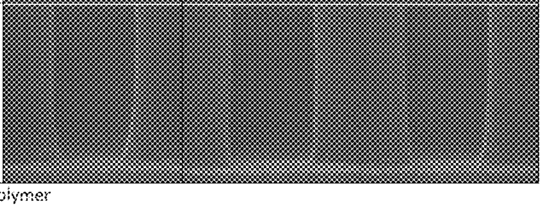 | | |
* based on 100pbw polymer
FIG. 2 (Table 5)

| | Acid | C1<br>Phenyl Phosphonic Acid<br>**pKa=1.88** | C2<br>Hexyl Phosphonic Acid<br>**pka=2.65** | C3<br>2-Ethyl-Hexyl Phosphate<br>**pKa=1.93** | C5<br>Benzyl Sulfonic Acid Hydrate<br>**pKa=-0.60** |
|---|---|---|---|---|---|
| Acid / Base (mol/mol) | 1 | 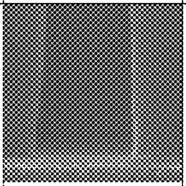<br>EX-4<br>162 $mJ/cm^2$ | --- | 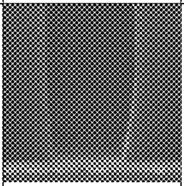<br>CF-5<br>162 $mJ/cm^2$ | CF-6<br>Large Film loss |
| | 0.78 | 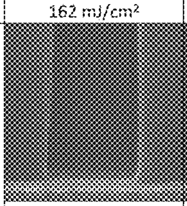<br>EX-3<br>155 $mJ/cm^2$ | 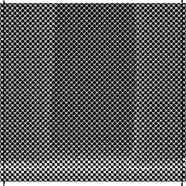<br>EX-6<br>157 $mJ/cm^2$ | 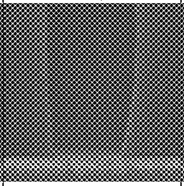<br>CF-4<br>155 $mJ/cm^2$ | 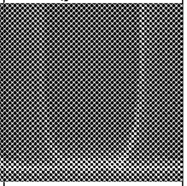<br>CF-7<br>58 $mJ/cm^2$ |
| | 0.57 | 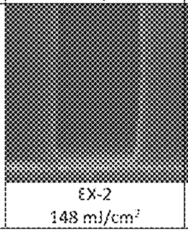<br>EX-2<br>148 $mJ/cm^2$ | 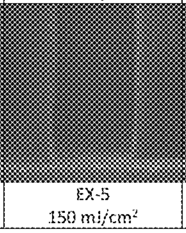<br>EX-5<br>150 $mJ/cm^2$ | 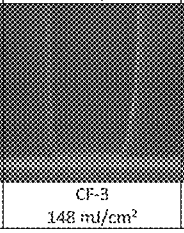<br>CF-3<br>148 $mJ/cm^2$ | 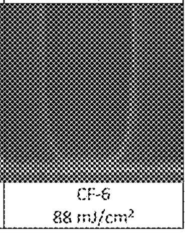<br>CF-6<br>88 $mJ/cm^2$ |

FIG. 3 (Table 6)

| Acid / Base (mol/mol) | Base | D4<br>T-BOC-4HP<br>pKa=-2.0 | D5<br>nicotine amide<br>pKa= 3.5 | D1<br>Troger's Base:<br>pka= 4.5 | D3<br>4-(p-tolyl)morpholine<br>pKa=5.71 | D2<br>ethyl-3-(morpholino) propionate<br>pKa= 6.6 |
|---|---|---|---|---|---|---|
| | 1.39 | | 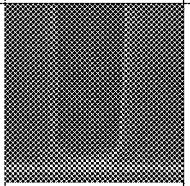<br>CF-14<br>170 mJ/cm² | | 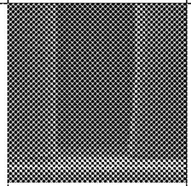<br>EX-14<br>101 mJ/cm² | |
| | 1.22 | | 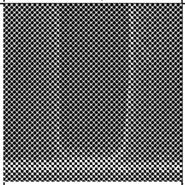<br>CF-13<br>178 mJ/cm² | | 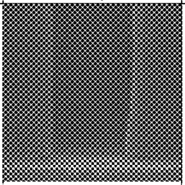<br>EX-13<br>101 mJ/cm² | |
| | 1 | 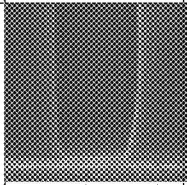<br>CF-11<br>117mJ/cm² | 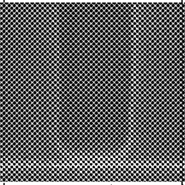<br>CF-12<br>202 mJ/cm² | 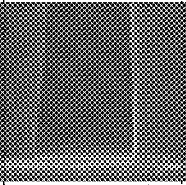<br>EX-4<br>162 mJ/cm² | 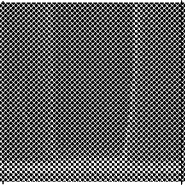<br>EX-12<br>101 mJ/cm² | 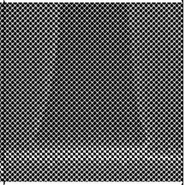<br>EX-10<br>140 mJ/cm² |
| | 0.78 | 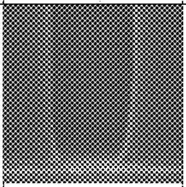<br>CF-10<br>117 mJ/cm² | | 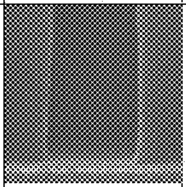<br>EX-3<br>155 mJ/cm² | --- | 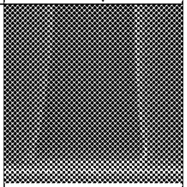<br>EX-9<br>159 mJ/cm² |
| | 0.57 | 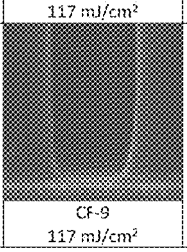<br>CF-9<br>117 mJ/cm² | | 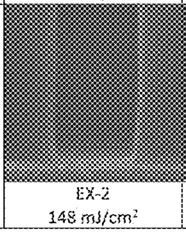<br>EX-2<br>148 mJ/cm² | 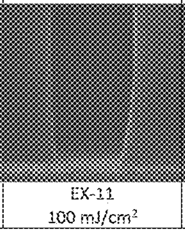<br>EX-11<br>100 mJ/cm² | 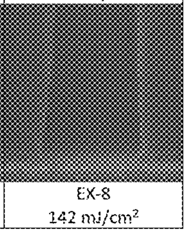<br>EX-8<br>142 mJ/cm² |

FIG. 4 (Table 7)

| Base | D4<br>tBOC-4HP | D6<br>N-Allylcaprolactam | D7<br>Benzotriazole | D5<br>Nicotinamide | D1<br>Troger's Base |
|---|---|---|---|---|---|
| Base Loading (pbw*) | 0.174 | 0.136 | 0.103 | 0.106 | 0.217 |
| pKa | -2.0 | -0.5 | 1.2 | 3.5 | 4.5 |
| Sample | CF-11 | CF-22 | CF-21 | CF-12 | EX-4 |
| Exposure Energy (mJ/cm$^2$) | 117 | 23 | 55 | 202 | 162 |
| Cross section profile 1.5 μm dense trenches | 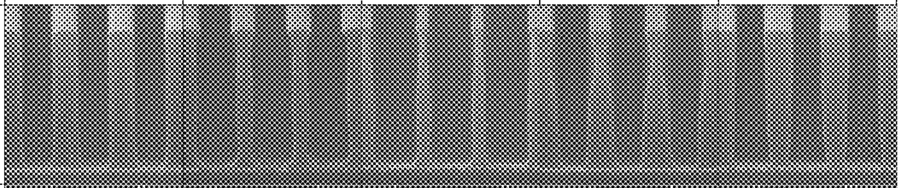 | | | | |
| Cross section profile at the bottom of 1.5 μm isolated trench | 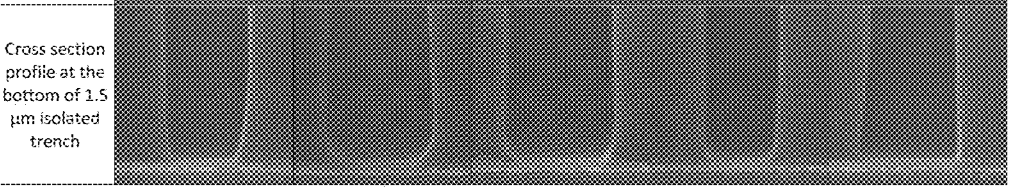 | | | | |
* based on 100pbw polymer
FIG. 5 (Table 8)

| Base | D8 Benzimidazole | D9 3-Pyridinepropanol | D10 4-(p-tolyl) morpholine | D2 ethyl-3-(morpholino) propionate | D10 4-morpholinoaniline |
|---|---|---|---|---|---|
| Base Loading (pbw*) | 0.102 | 0.137 | 0.137 | 0.164 | 0.154 |
| pKa | 5.3 | 5.4 | 5.7 | 6.6 | 6.7 |
| Sample | CF-20 | CF-15 | EX-12 | EX-10 | CF-19 |
| Exposure Energy (mJ/cm²) | 178 | 170 | 101 | 140 | NA |
| Cross section profile 1.5μm dense trenches | 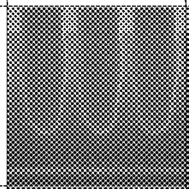 | 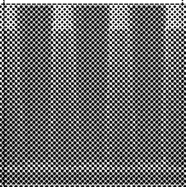 | 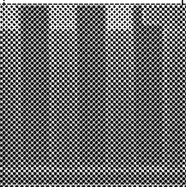 | 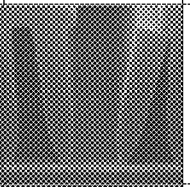 | Precipitation was observed after mixing |
| Cross section profile at the bottom of 1.5μm isolated trench | 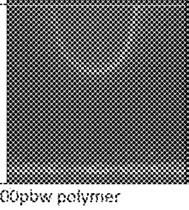 | 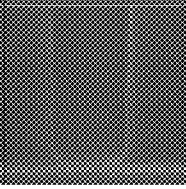 | 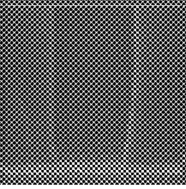 | 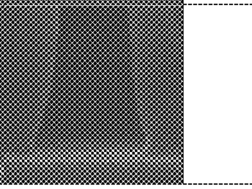 | |
* based on 100pbw polymer
FIG. 6 (Table 9)

| PAG | B1<br>NHNI-TF | B2<br>NHNI-PFBS |
|---|---|---|
| PAG Loading (pbw*) | 1.30 | 1.86 |
| Sample | EX-4 | CF-22 |
| Exposure Energy (mJ/cm²) | 162 | 165 |
| Cross section profile 1.5μm dense trenches | 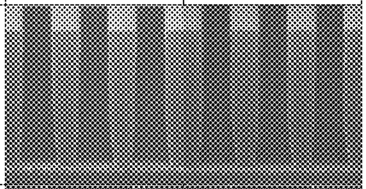 | |
| Cross section profile at the bottom of 1.5μm isolated trench | 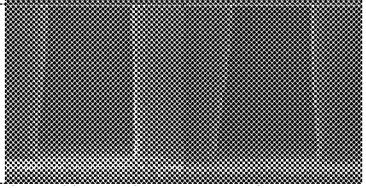 | |
* based on 100pbw polymer
FIG. 7 (Table 10)

METALLIZATION METHOD

CROSS-REFERENCE TO RELATED APPLICATIONS

This application claims the benefit of U.S. Provisional Application No. 63/392,275, filed Jul. 26, 2022, which is incorporated by reference herein in its entirety.

BACKGROUND

This disclosure relates to a patterning process for manufacturing semiconductors. In particular, this disclosure relates to a patterning process for manufacturing semiconductors that prevents the development of a footing profile in a photoresist pattern.

Mobile devices, devices that are part of the internet of things (IoT) and wearable electronics have over the years become smaller, lighter and thinner devices that despite increasing miniaturization use larger amounts of memory and perform increasingly larger amounts of computation.

The manufacture and packaging of these electronic devices serves an important role in the size reduction. For example, flip-chip packaging methods have been used to increase the density of I/O (Input/Output) connections between devices, especially for micro-processing unit (MPU) and dynamic random-access memory (DRAM) semiconductor chips.

Metal pillar bumps such as, for example, copper pillar bumps are often used as a flip chip interconnect for use in electronics and optoelectronic packaging, including: flip chip packaging of CPU and GPU integrated circuits (chips), laser diodes, and semiconductor optical amplifiers (SOA). Metal pillar bumps provide beneficial connection resistance, high-density connections, metal migration resistance, and thermal dissipation properties. Metal line patterns may also be used, for example in a re-distribution layer (RDL), for providing electrical connection between two components.

Electroplating been used for the fabrication of metal pillar bump arrays and line patterns. A photoresist layer is coated on a copper film surface and a mask pattern is then manufactured using photolithography. Metal structures are then formed on the metal surface by electroplating in open areas of the mask pattern. The photoresist is then removed and the metal layer that was previously covered by the resist is removed by etching.

One approach to the preparation of plating mask patterns is the use of thick photoresist layers to respond to the need for thicker and narrower pattern sizes for further increases in I/O and device density. Chemically amplified photoresists may be a suitable option for achieving the faster sensitivity and improved transparency desired for higher resolution patterns. Such resist compositions include a polymer having acid labile groups, a photoacid generator (PAG), and a solvent. However, when chemically amplified resists are formed on a metal layer, such as a copper layer, footing profile issues have been observed due to loss of photoacid present at the interface between the metal surface and the resist.

The footing in the resist pattern results in an undercut profile in the plated pattern. This can promote collapse of the plated patterns during downstream processing. Thus, it is desired that footing of photoresist patterns used as plating masks is eliminated and an undercut resist pattern profile is provided to overcome the collapse of plated patterns.

SUMMARY

Disclosed herein is a metallization method, comprising (a) providing a photoresist layer on a first surface of a substrate, wherein the photoresist layer is formed from a photoresist composition comprising: a polymer comprising acid-labile groups; a photoacid generator; an organic phosphonic acid; and a solvent; (b) pattern-wise exposing the photoresist layer to activating radiation; (c) developing the exposed photoresist layer with a basic developer to form a photoresist pattern; and (d) after forming the photoresist pattern, plating a metal on the first surface of the substrate using the photoresist pattern as a plating mask.

BRIEF DESCRIPTION OF THE FIGURES

FIGS. 2-7 depicts the Tables 5-10 respectively, which include data from working examples.

DETAILED DESCRIPTION

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise.

As used herein, an "acid-labile group" refers to a group in which a bond is cleaved by the catalytic action of an acid, optionally and typically with thermal treatment, resulting in a polar group, such as a carboxylic acid or an alcohol group, being formed on the polymer, and optionally and typically with a moiety connected to the cleaved bond becoming disconnected from the polymer. Such acid is typically a photo-generated acid with bond cleavage occurring during post-exposure baking. Suitable acid-labile groups include, for example: tertiary alkyl ester groups, secondary or tertiary aryl ester groups, secondary or tertiary ester groups having a combination of alkyl and aryl groups, tertiary alkoxy groups, acetal groups, or ketal groups. Acid-labile groups are also commonly referred to in the art as "acid-cleavable groups," "acid-cleavable protecting groups," "acid-labile protecting groups," "acid-leaving groups," "acid-decomposable groups," and "acid-sensitive groups."

Disclosed herein is a method for manufacturing semiconductors that minimizes the occurrence of footing in the photoresist layer during the manufacturing process. Footing causes an undercut of a plated pattern, which may promote a collapsing of the plated pattern during further process and reliability testing. It is therefore desirable to eliminate or to minimize footing of the plated pattern.

A photoresist composition that comprises a polymer, a non-ionic photoacid generator and phosphonic acid is disposed on a substrate to form a photoresist layer. The photoresist layer is patternwise exposed to activating radiation. The exposed photoresist layer is then developed with a basic developer, thereby removing portions of the photoresist layer to form a relief pattern. A metal may be plated on the first surface of the substrate after forming the relief pattern.

Figure 1A:
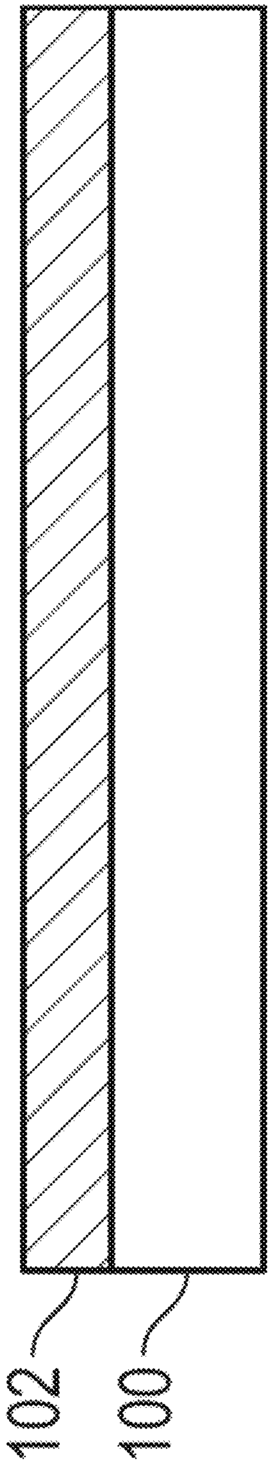
FIG. 1A depicts an exemplary embodiment of the substrate upon which at first metal layer is disposed.
Figure 1B:
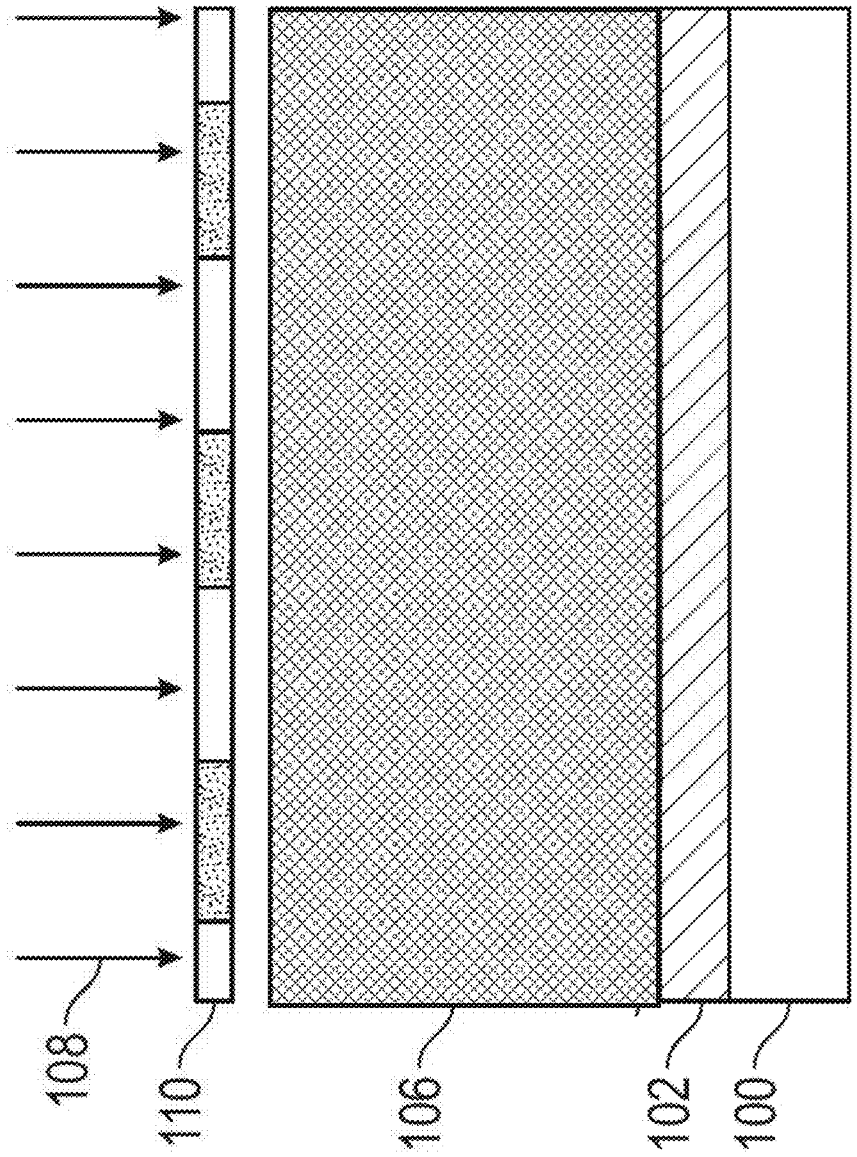
FIG. 1B depicts an exemplary embodiment of the deposition of the photoresist layer on the first metal layer and the photopatterning of the photoresist layer and the first metal layer.

FIGS. 1A-1E depict a method of forming a plated pattern on a substrate. FIG. 1A depicts the substrate 100 upon which at first metal layer 102 is disposed. FIG. 1B depicts the coating of the photoresist layer 106 on the metal layer 102 followed by photo-exposure of the photoresist layer 106. The photoresist layer 106 comprises a photoacid generator and a polymer that contains an acid labile group. After coating the photoresist layer 106, the photoresist layer 106 is patternwise exposed to activating radiation 108 through a photomask 110 having optically opaque and optically transparent regions. A UV light having a wavelength of 10 to 400 nanometers may be used in the photopatterning.

Figure 1C:
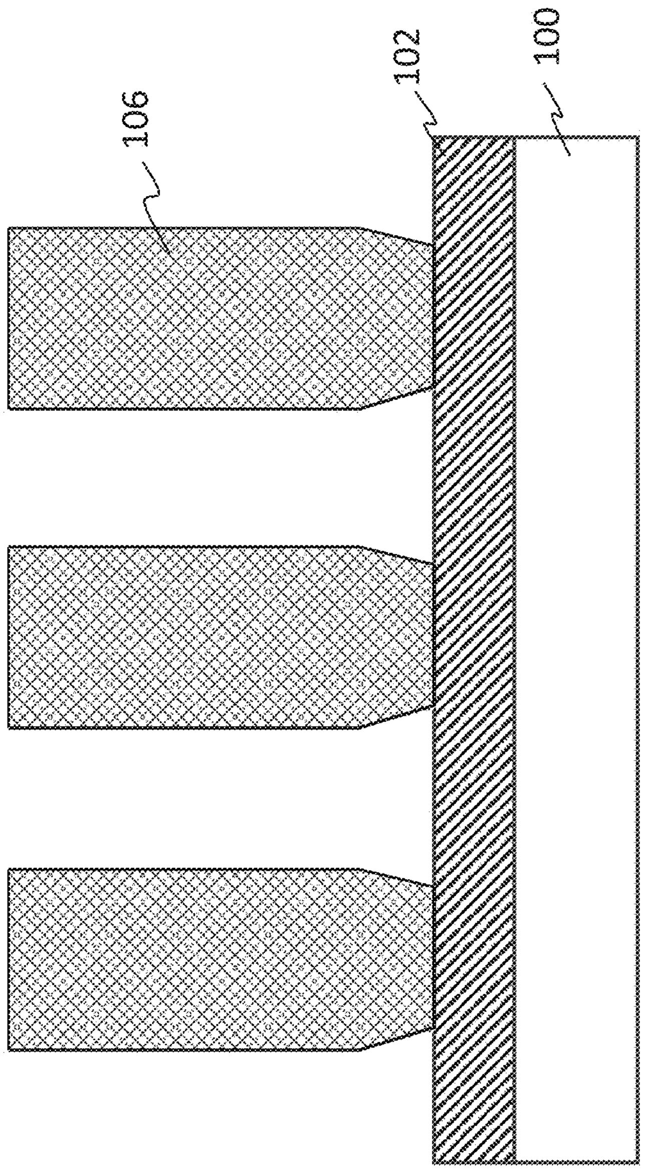
FIG. 1C depicts an exemplary embodiment of the development of the photoresist layer.
Figure 1D:
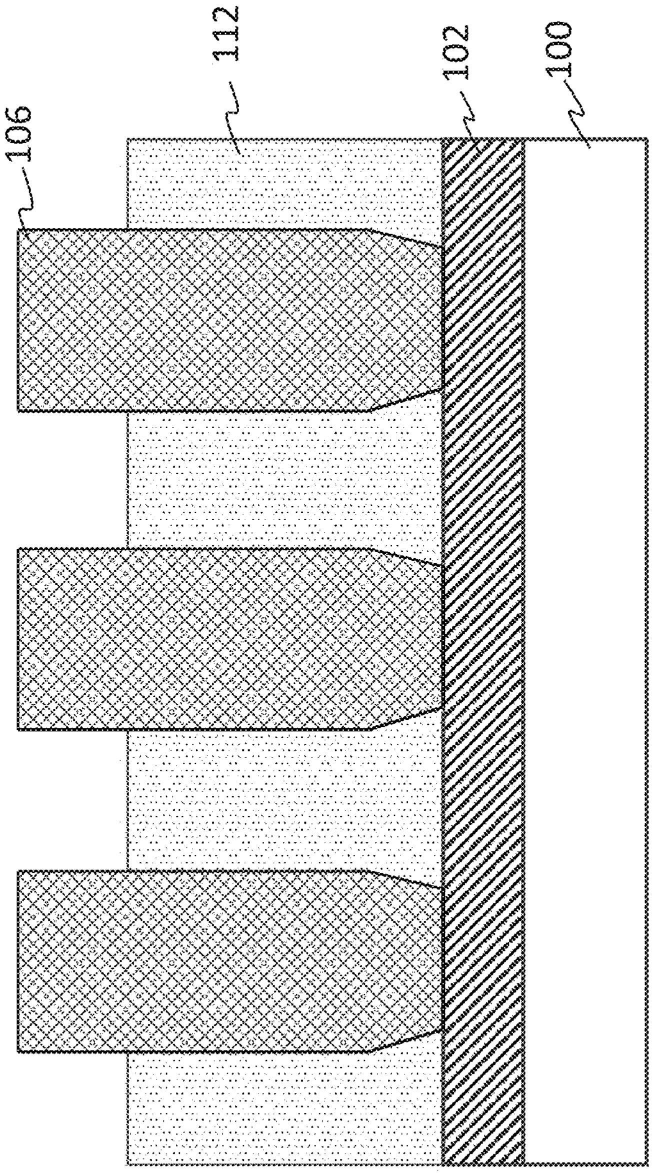
FIG. 1D is an exemplary depiction of the deposition of metal (via plating) on the metal layer.
Figure 1E:
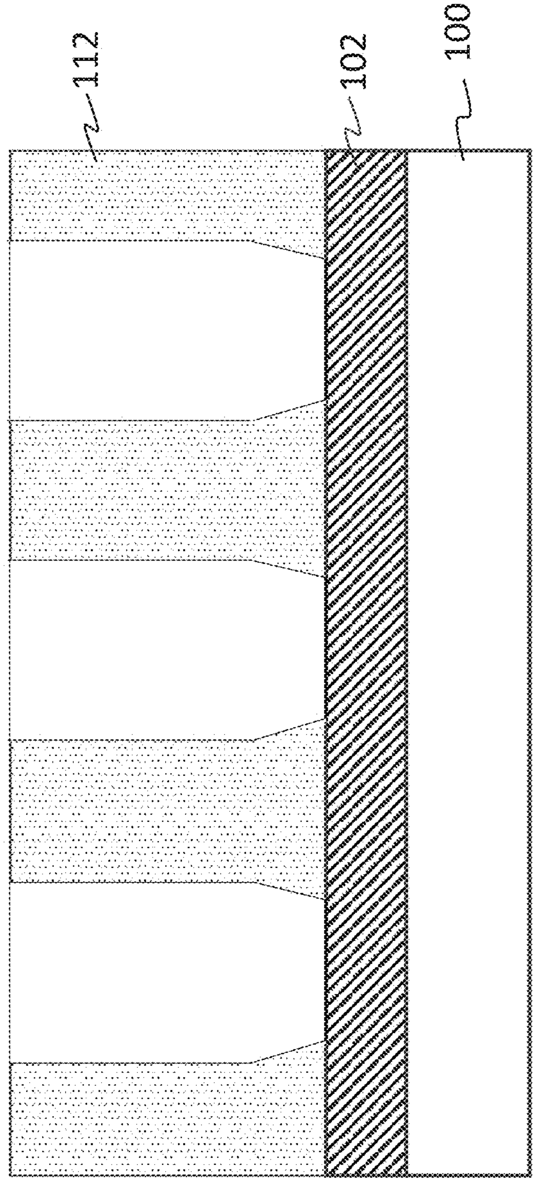
FIG. 1E depicts the plated metal structures left behind after removal of the remaining photoresist layer.

FIG. 1C depicts the development of the exposed parts of the photoresist layer 106. The exposed portions of the photoresist layer 106 are removed via development as seen in the FIG. 1C. After metal plating as seen in FIG. 1D, the remaining portions of the photoresist layer can be removed (stripped) from the substrate to leave behind the plated metal structures 112. FIG. 1E depicts the plated metal structures 112 left behind after removal of the remaining photoresist layer.

The various layers (depicted in the FIGS. 1A-1E) and their respective compositions described above will now be described in detail.

The Substrate

Examples of the substrate include, but are not limited to, silicon wafers, glass substrates and plastic substrates, such substrates optionally including one or more layers or features formed thereon. A preferred substrate is a silicon wafer.

The Metal Layer

FIG. 1A depicts the substrate 100 upon which at first metal layer 102 is disposed. An optional second metal layer (not shown) may be disposed on the first metal layer 102. The first metal layer can be made, for example, of titanium, silver, aluminum, gold, copper, or an alloy thereof. In an exemplary embodiment, the first metal layer 102 comprises titanium or copper. When a second metal layer is disposed on the first metal layer, the first metal layer preferably comprises titanium. The metal first layer can be formed using known methods, for example, by chemical vapor deposition (CVD), plasma enhanced chemical vapor deposition (PECVD) or physical vapor deposition (PVD) techniques, with sputtering and plating being typical. The thickness of the first metal layer 102 is typically from 10 nm to 500 nm.

The optional second metal layer comprises tantalum, titanium, copper, silver, aluminum, gold, or an alloy thereof. The second metal layer is chemically different from the first metal layer 102. In an exemplary embodiment, the second metal layer comprises copper. The second metal layer may be disposed on the surface of the first metal layer via chemical vapor deposition (CVD), plasma enhanced chemical vapor deposition (PECVD), physical vapor deposition (PVD), or a combination thereof. The thickness of the second metal layer is typically from 10 nm to 500 nm.

The Photoresist Layer

FIG. 1B depicts the deposition of the photoresist layer 106 on the first metal layer 102. The photoresist layer 106 comprises a polymer, a photoacid generator, a phosphonic acid and a base quencher. The polymer comprises first repeat units that comprise an acid labile group. In an embodiment, the polymer comprises second repeat units that comprise a vinyl aromatic group.

The acid labile group is a chemical moiety that undergoes a deprotection reaction in the presence of an acid. Deprotection of some acid labile groups that are used in the examples are brought on by heat. Acetal protection groups readily undergo deprotection at room temperature. The polymer of the photoresist composition undergoes a change in solubility in a developer as a result of reaction with acid generated from the photoacid generator (included in the photoresist composition) following soft bake, exposure to activating radiation and post exposure bake. This results from photoacid-induced cleavage of the acid labile group causing a change in polarity of the polymer. The acid labile group can be chosen, for example, from tertiary alkyl carbonates, tertiary alkyl esters, tertiary alkyl ethers, acetals and ketals. Preferably, the acid labile group is an ester group that contains a tertiary non-cyclic alkyl carbon or a tertiary alicyclic carbon covalently linked to a carboxyl oxygen of an ester of the polymer. The cleavage of such acid labile groups results in the formation of carboxylic acid groups.

In one embodiment, the polymer that comprises the acid-labile group includes polymerized units having the structure shown in formula (1) below:

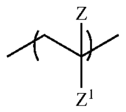

(1)

wherein Z is selected from a hydrogen atom, substituted or unsubstituted $C_1$-$C_4$ alkyl, substituted or unsubstituted $C_1$-$C_4$ fluoroalkyl or a cyano group; $Z^1$ is a non-hydrogen substituent comprising an acid-labile group, the cleavage of which forms a carboxylic acid on the polymer.

In an embodiment, the acid-labile group which, on decomposition, forms a carboxylic acid group on the polymer is preferably a tertiary ester group of the formula —$C(O)OC(R^1)_3$ or an acetal group of the formula —$C(O)OC(R^2)_2OR^3$, wherein: $R^1$ is each independently linear $C_{1-20}$ alkyl, branched $C_{3-20}$ alkyl, monocyclic or polycyclic $C_{3-20}$ cycloalkyl, linear $C_{2-20}$ alkenyl, branched $C_{3-20}$ alkenyl, monocyclic or polycyclic $C_{3-20}$ cycloalkenyl, monocyclic or polycyclic $C_{6-20}$ aryl, or monocyclic or polycyclic $C_{2-20}$ heteroaryl, preferably linear $C_{1-6}$ alkyl, branched $C_{3-6}$ alkyl, or monocyclic or polycyclic $C_{3-10}$ cycloalkyl, each of which is substituted or unsubstituted, each $R^1$ optionally including as part of its structure one or more groups chosen from —O—, —C(O)—, —C(O)—O—, or —S—, and any two $R^1$ groups together optionally forming a ring; $R^2$ is independently hydrogen, fluorine, linear $C_{1-20}$ alkyl, branched $C_{3-20}$ alkyl, monocyclic or polycyclic $C_{3-20}$ cycloalkyl, linear $C_{2-20}$ alkenyl, branched $C_{3-20}$ alkenyl, monocyclic or polycyclic $C_{3-20}$ cycloalkenyl, monocyclic or polycyclic $C_{6-20}$ aryl, or monocyclic or polycyclic $C_{2-20}$ heteroaryl, preferably hydrogen, linear $C_{1-6}$ alkyl, branched $C_{3-6}$ alkyl, or monocyclic or polycyclic $C_{3-10}$ cycloalkyl, each of which is substituted or unsubstituted, each $R^2$ optionally including as part of its structure one or more groups chosen from —O—, —C(O)—, —C(O)—O—, or —S—, and the $R^2$ groups together optionally forming a ring; and $R^3$ is linear $C_{1-20}$ alkyl, branched $C_{3-20}$ alkyl, monocyclic or polycyclic $C_{3-20}$ cycloalkyl, linear $C_{2-20}$ alkenyl, branched $C_{3-20}$ alkenyl, monocyclic or polycyclic $C_{3-20}$ cycloalkenyl, monocyclic or polycyclic $C_{6-20}$ aryl, or monocyclic or polycyclic $C_{2-20}$ heteroaryl, preferably linear $C_{1-6}$ alkyl, branched $C_{3-6}$ alkyl, or monocyclic or polycyclic $C_{3-10}$ cycloalkyl, each of which is substituted or unsubstituted, $R^3$ optionally including as part of its structure one or more groups chosen from —O—, —C(O)—, —C(O)—O—, or —S—, and one $R^2$ together with $R^3$ optionally forming a ring. Such monomer is typically a vinyl aromatic, (meth)acrylate, or norbornyl monomer.

Suitable acid labile-group containing units include, for example, acid-labile (alkyl)acrylate units, such as t-butyl (meth)acrylate, 1-methylcyclopentyl (meth)acrylate, 1-ethylcyclopentyl (meth)acrylate, 1-isopropylcyclopentyl (meth)acrylate, 1-propylcyclopentyl (meth)acrylate, 1-methylcyclohexyl (meth)acrylate, 1-ethylcyclohexyl (meth)acrylate, 1-isopropylcyclohexyl (meth)acrylate, 1-propylcyclohexyl (meth)acrylate, methyladamantyl(meth) acrylate, ethyladamantyl(meth)acrylate, and the like, and other cyclic, including alicyclic, and non-cyclic (alkyl) acrylates.

Acetal and ketal acid labile groups can be substituted for the hydrogen atom at the terminal of an alkali-soluble group such as a carboxyl group so as to be bonded with an oxygen atom. When acid is generated, the acid cleaves the bond between the acetal or ketal group and the oxygen atom to which the acetal-type acid-dissociable, dissolution-inhibiting group is bonded. Exemplary such acid labile groups are described, for example, in U.S. Pat. Nos. 6,057,083, 6,136,501 and 8,206,886 and European Pat. Pub. Nos. EP01008913A1 and EP00930542A1. Also suitable are acetal and ketal groups as part of sugar derivative structures, the cleavage of which would result in the formation of hydroxyl groups, for example, those described in U.S. Patent Application No. US2012/0064456A1.

Suitable polymers include, for example, phenolic resins that contain acid-labile groups. Particularly preferred resins of this class include: (i) polymers that contain polymerized units of a vinyl phenol and an acid labile (alkyl) acrylate as described above, such as polymers described in U.S. Pat. Nos. 6,042,997 and 5,492,793; (ii) polymers that contain polymerized units of a vinyl phenol, an optionally substituted vinyl phenyl (e.g., styrene) that does not contain a hydroxy or carboxy ring substituent, and an acid labile (alkyl) acrylate such as described above, such as polymers described in U.S. Pat. No. 6,042,997; (iii) polymers that contain repeat units that comprise an acetal or ketal moiety that will react with photoacid, and optionally aromatic repeat units such as phenyl or phenolic groups; such polymers described in U.S. Pat. Nos. 5,929,176 and 6,090,526, and blends of (i) and/or (ii) and/or (iii). Such polymers are useful for imaging at wavelengths, for example, of 200 nm or greater, such as 248 nm and 365 nm.

Suitable polymers include those that are useful for imaging at certain sub-200 nm wavelengths such as 193 nm, such as those disclosed in European Patent Publication No. EP930542A1 and U.S. Pat. Nos. 6,692,888 and 6,680,159. For imaging at 193 nm wavelength, the polymers are preferably substantially free (e.g., less than 15 mole %), preferably completely free of phenyl, benzyl or other aromatic groups where such groups are highly absorbing of the radiation.

Other suitable polymers for use in the photoresist composition include, for example, those which contain polymerized units of a non-aromatic cyclic olefin (endocyclic double bond) such as an optionally substituted norbornene, for example, polymers described in U.S. Pat. Nos. 5,843,624 and 6,048,664. Still other suitable polymers for use in the photoresist composition include polymers that contain polymerized anhydride units, particularly polymerized maleic anhydride and/or itaconic anhydride units, such as disclosed in European Published Application EP01008913A1 and U.S. Pat. No. 6,048,662.

Also suitable for use in the photoresist composition is a polymer that contains repeat units that contain a hetero atom, particularly oxygen and/or sulfur (but other than an anhydride, i.e., the unit does not contain a keto ring atom). The heteroalicyclic unit can be fused to the polymer backbone and can comprise a fused carbon alicyclic unit such as provided by polymerization of a norbornene group and/or an anhydride unit such as provided by polymerization of a maleic anhydride or itaconic anhydride. Such polymers are disclosed in International Pub. No. WO0186353A1 and U.S. Pat. No. 6,306,554. Other suitable hetero-atom group containing polymers include polymers that contain polymerized carbocyclic aryl units substituted with one or more hetero-atom (e.g., oxygen or sulfur) containing groups, for example, hydroxy naphthyl groups, such as disclosed in U.S. Pat. No. 7,244,542.

The polymer may further include a unit that contains a lactone moiety for controlling the dissolution rate of the polymer and the photoresist composition. Suitable monomers for use in the polymer containing a lactone moiety include, for example, the following:

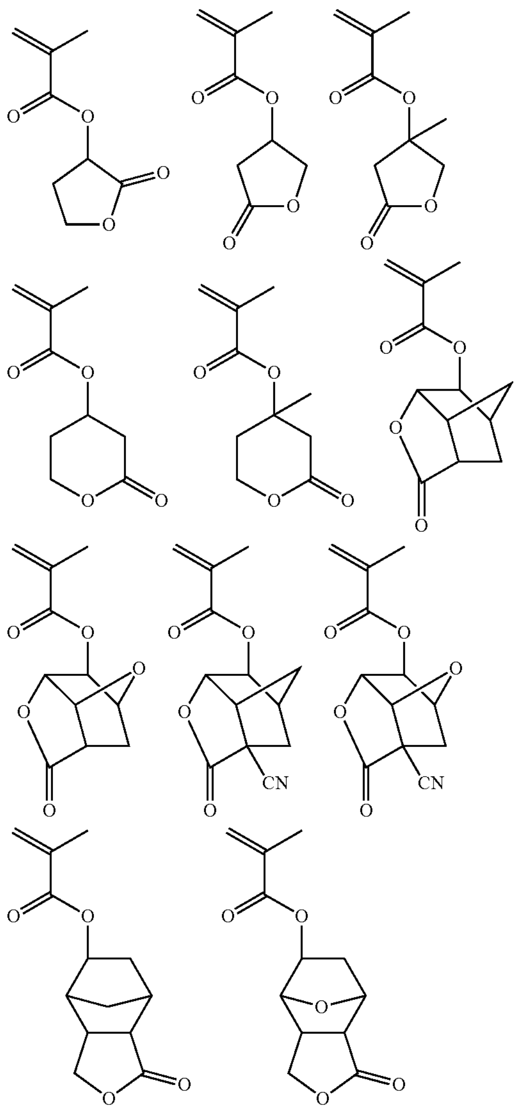

-continued

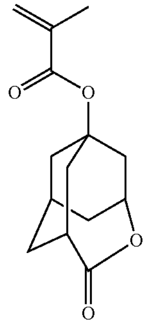
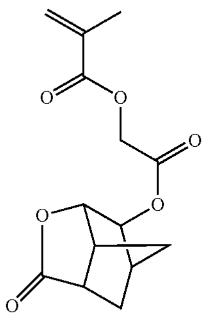
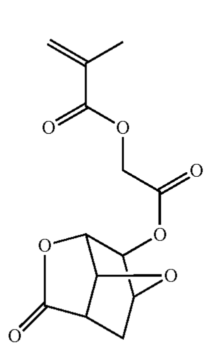
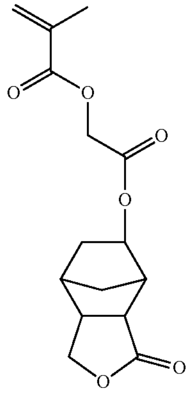
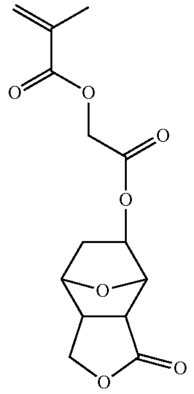
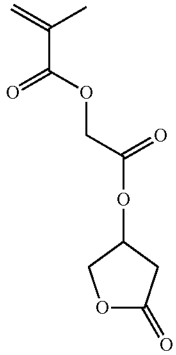
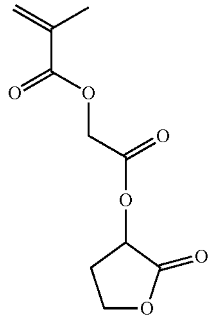
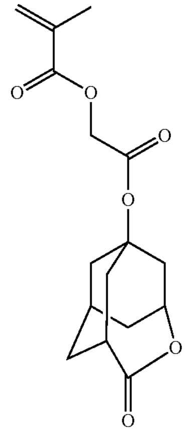

In an embodiment, the polymer further typically includes a unit containing a polar group, which enhances etch resistance of the polymer and photoresist composition and provides additional means to control the dissolution rate of the polymer and photoresist composition. Monomers for forming such a unit include, for example, the following:

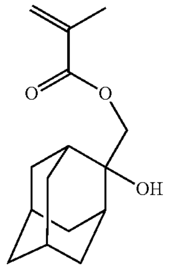
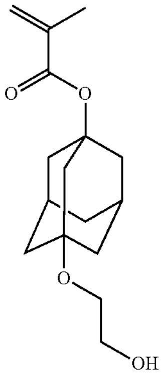
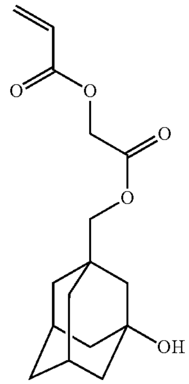
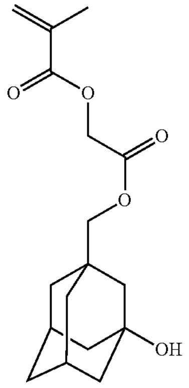
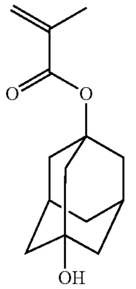
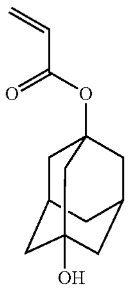

The polymer can include one or more additional units of the types described above. Typically, the additional units for the polymer will include the same or similar polymerizable group as those used for the monomers used to form the other units of the polymer, but may include other, different polymerizable groups in the same polymer backbone.

The polymer may also include one or more repeat units derived from the polymerization of a vinyl aromatic monomer. An exemplary vinyl aromatic monomer is styrene. In an embodiment, a polymer derived from a vinyl aromatic monomer has the structure shown in formula (2) below:

(2)

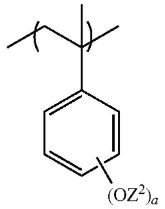

wherein a is 1 to 5 and where $Z^2$ is a hydrogen or an alkyl group having 1 to 5 carbon atoms. In a preferred embodiment, a is 1 and $Z^2$ is hydrogen. It is preferable for the vinyl aromatic monomer to have a hydroxyl group located in the para-position on the aryl ring. A preferred vinyl aromatic polymer is poly(p-hydroxystyrene) (abbreviated as PHS).

In an embodiment, the polymer for use in the photoresist composition may have the structure shown in formula (3) below

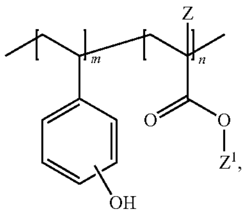
(3)

where Z is hydrogen atom or a methyl group and $Z^1$ is a non-hydrogen substituent that provides an acid-labile moiety as detailed above in formula (1). In an embodiment, m+n is equal to 100 mole percent (mole %). In an embodiment, m is 10 to 80 mole %, preferably 20 to 70 mole % and n is 20 to 90 mole %, preferably 25 to 80 mole %, preferably 30 to 40 mole %, based on total polymerized units present in the polymer. In an embodiment, the mole ratio of n to m is 0.7 to 9.

When the polymer comprises third repeat units (that are different from the first repeat units and the second repeat units), the third repeat units may be present in the polymer in an amount of 15 to 35 mole % and preferably 20 to 30 mole %, based on total polymerized units present in the polymer. The third repeat unit may be present in the polymer in an amount of 15 to 35 mole % and preferably 20 to 30 mole %, based on total polymerized units present in the polymer.

While not to be limited thereto, exemplary polymers include, for example, the following:

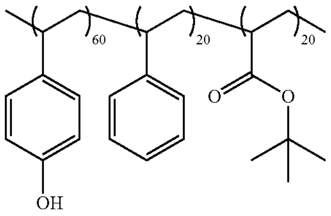

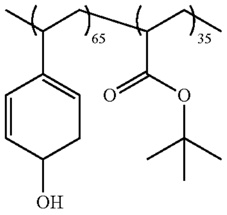

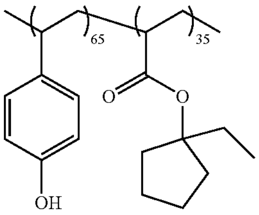

-continued

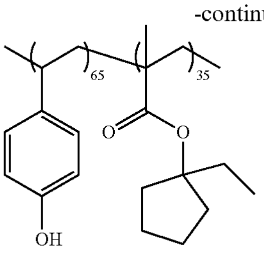

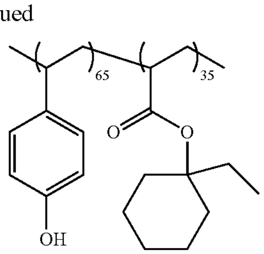

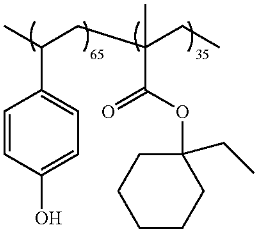

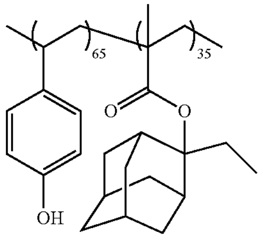

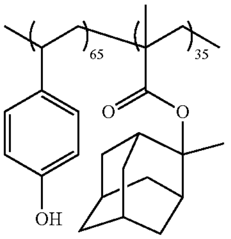

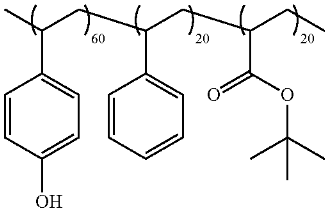

Other exemplary polymers that may be used in the photoresist composition include, for example, the following:

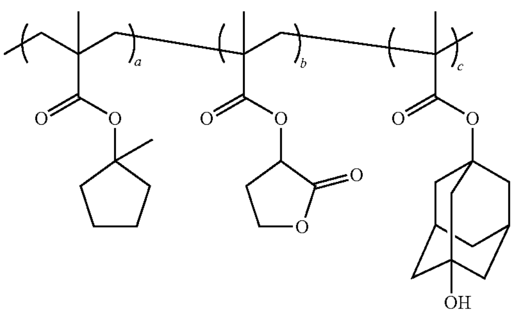

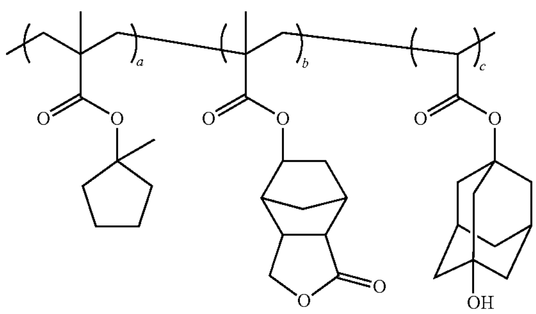

-continued
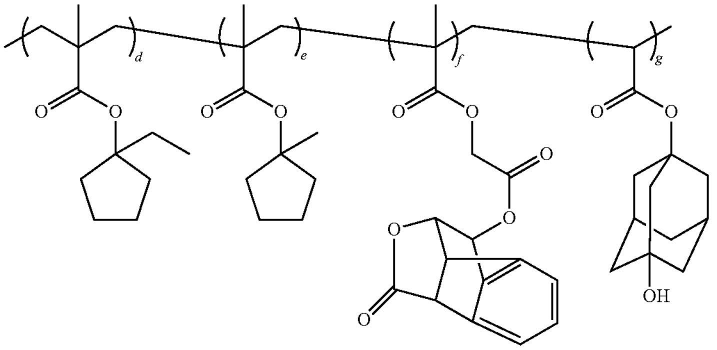
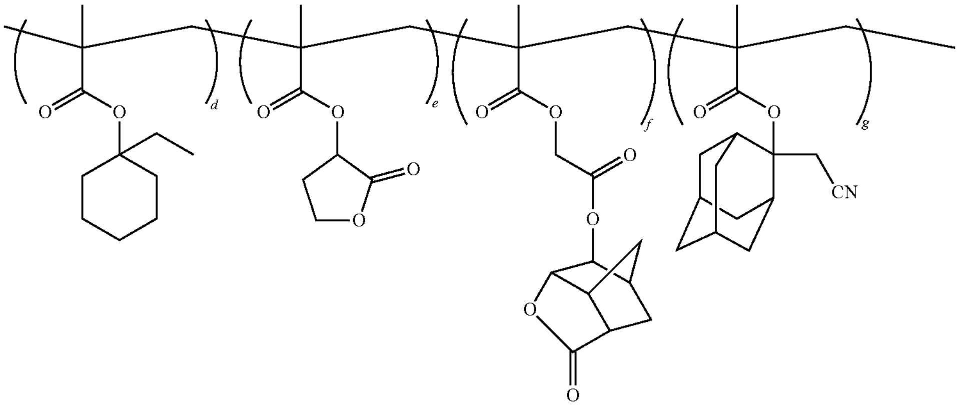
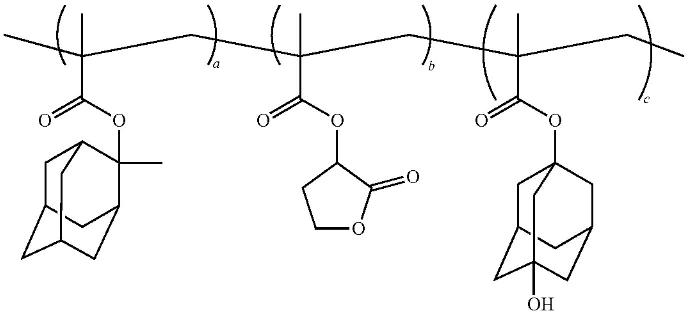
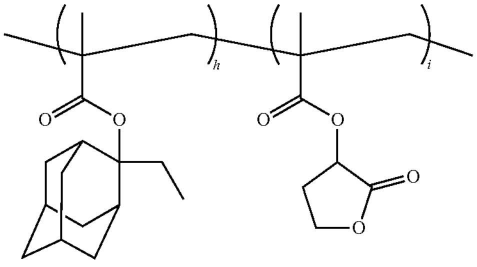
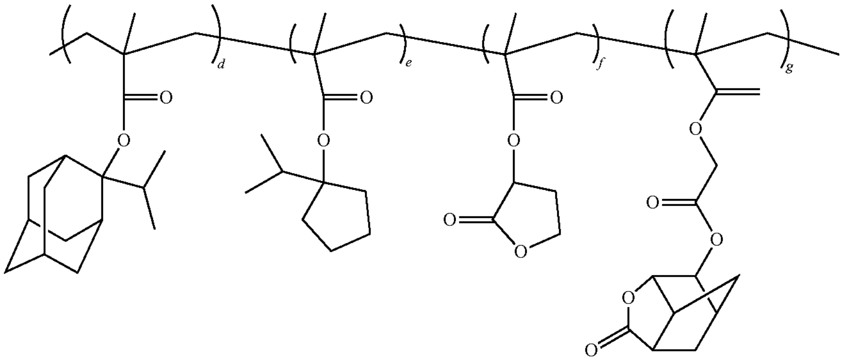

-continued

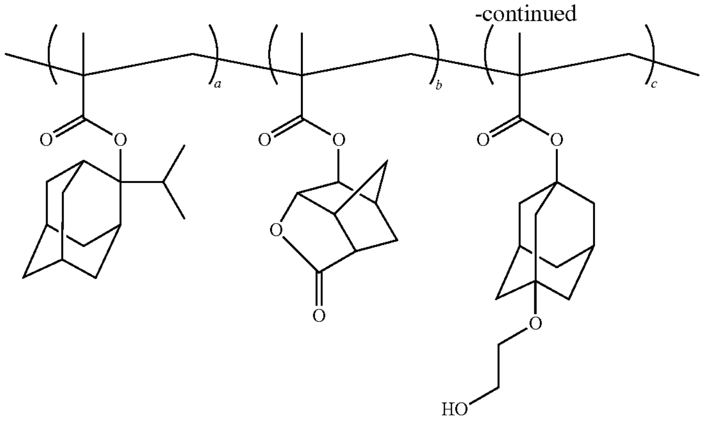

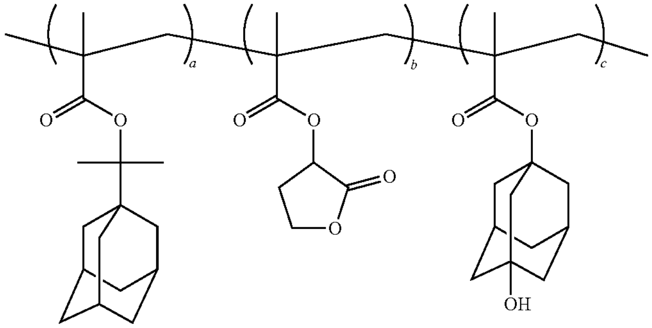

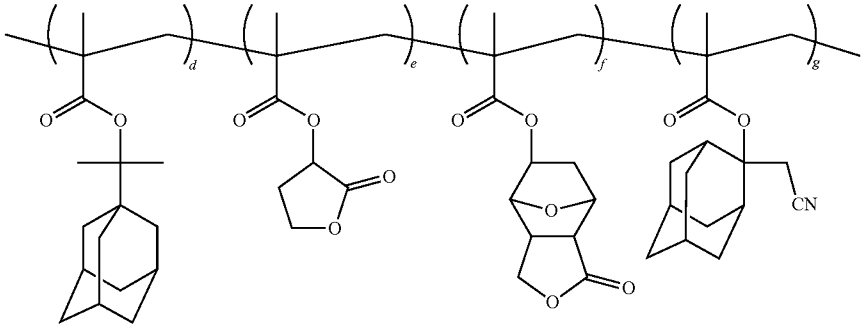

where a+b+c, d+e+f+g and h+i are equal to 100 mole % based on total polymerized units present in the polymer.

Suitable polymers for use in the photoresist compositions are commercially available and can readily be made by persons skilled in the art. The polymer is present in the photoresist composition in an amount sufficient to render an exposed coating layer of the photoresist developable in a suitable developer solution.

Typically, the polymer is present in the photoresist composition in an amount of from 70 to 100 wt % based on total solids of the photoresist composition. The weight average molecular weight $M_w$ of the polymer is typically less than 100,000, for example, from 4000 to 100,000, more typically from 4000 to 20,000 grams per mole (g/mole) as measured by gel permeation chromatography using a polystyrene standard. Blends of two or more of the above-described polymers can suitably be used in the photoresist composition of the invention.

The photoresist composition comprises a non-ionic photoacid generator. In an embodiment, the photoresist composition may optionally contain an ionic photoacid generator. It is desirable to use photoacid generators that generate the photoacid by a Norrish-1 cleavage. The Norrish-I reaction is the photochemical cleavage or homolysis of aldehydes and ketones into two free radical intermediates. The carbonyl group accepts a photon and is excited to a photochemical singlet state. In an embodiment, the photoacid generator has the structure shown in formula (4)

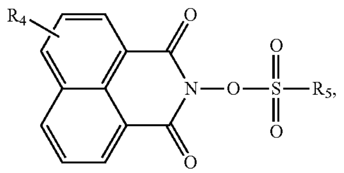

(4)

wherein in formula (4), $R_4$ is a hydrogen atom, a substituted or unsubstituted, linear or branched $C_1$ to $C_{14}$ alkyl group, a substituted heterocyclic group, or a halogen atom; and wherein $R_5$ is a substituted or unsubstituted alkyl group having 1 to 18 carbon atoms; a halogen atom, or an aryl group having 6 to 20 unsubstituted carbon atoms.

Examples of suitable photoacid generators are N-hydroxynaphthalimide trifluoromethanesulfonate (NHNI-TF), N-hydroxynaphthalimide perfluoro-1-butanesulfonate (NHNI-PFBS), N-hydroxynaphthalimide camphor-10-sulfonate, N-hydroxynaphthalimide 2-trifluoromethyl phenyl sulfonate, N-hydroxy-5-norbornene-2,3-dicarboximide perfluoro-1-butanesulfonate, N-(trifluoromethyl sulfonyloxy)phthalimide, N-hydroxysuccinimide perfluorobutanesulfonate or benzeneacetonitrile, 2-methyl-α-[2-[[(propylsulfonyl)oxy]imino]-3(2H)-thienylidene]-(commercially available as IRGACURE PAG 103). In a preferred embodiment, the photoacid generator may be one or more of the structures of formulas (4a) or (4b) shown below (4a)

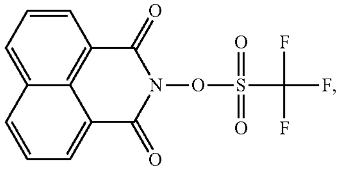

NHNI-TF (4b)

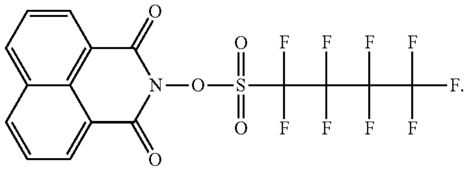

NHNI-PFBS

The photoacid generator is present in the photoresist composition in an amount of from 0.2 to 15 wt %, more typically 0.3 to 5 wt %, and more preferably 0.5 to 2 wt %, based on total solids of the photoresist composition. By minimizing photoacid generator loading, UV transparency of the photoresist also can be minimized. It increases UV transparency of photoresist layer. Then enough UV irradiation that through the photoresist layer may reach the UV sensitizer in the underlayer.

The photoresist composition comprises a phosphonic acid which facilitates a reduction in footing during semiconductor manufacturing. The phosphonic acid has the structure shown in formula (5) below $$RPO(OH)_2 \qquad (5),$$

where R is a substituted or unsubstituted aliphatic, alicyclic or aromatic group that is directly bonded to the phosphorus atom. The R group is not bonded to the phosphorus atom through an oxygen atom. When R is a substituted or unsubstituted aliphatic group it may be linear or branched. In an embodiment, R may be an alkyl group, an alkenyl group, an alkynyl group, a cycloalkyl group, a cycloalkenyl group, an aryl group, an arylalkyl group, or a combination thereof.

In an embodiment, the phosphonic acid has the structure shown in formula (6) below (6)

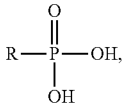

where R is as described above.

Examples of aliphatic phosphonic acids are $C_1$-$C_{18}$ normal alkyl phosphonic acids such as for example, butyl phosphonic acid, pentyl phosphonic acid, hexyl phosphonic acid, octyl phosphonic acid, n-decyl phosphonic acid, n-dodecylphosphonic acid, n-hexadecylphosphonic acid, n-hexylphosphonic acid, n-octadecylphosphonic acid, n-octylphosphonic acid, n-tetradecylphosphonic acid, or the like, or a combination thereof.

Examples of aromatic phosphonic acids include phenyl phosphonic acid, benzylphosphonic acid, (4-aminobenzyl) phosphonic acid (4-aminophenyl) phosphonic acid, (4-hydroxyphenyl) phosphonic acid, benzhydryl phosphonic acid, (2-phenylethyl) phosphonic acid, 4-methoxyphenyl phosphonic acid, (pyridin-3-ylmethyl) phosphonic acid, or the like, or a combination thereof. In a preferred embodiment, the phosphonic acid is phenyl phosphonic acid.

In an embodiment, the phosphonic acid is present in the photoresist composition in an amount of 0.01 to 0.50, preferably 0.05 to 0.20 parts by weight per 100 parts of acid labile polymer. When the amount of phosphonic acid in the photoresist composition is below 0.01 to parts by weight per 100 parts of the acid labile polymer, the footing in the photoresist layer is not minimized. When the amount of phosphonic acid in the photoresist composition is greater than 0.20 parts by weight per 100 parts of the acid labile polymer, the pattern in the photoresist layer tends to collapse due to the presence of a narrow foot.

In addition to the phosphonic acid, other acids such as phosphoric acid and phosphates may also be added to the photoresist composition.

The photoresist composition also contains a base quencher. The base quencher enhances the resolution of the developed resist relief image. The base quencher is preferably a tertiary amine compound that is added in an amount effective to render the photoresist composition with a pKa of less than 7. In an embodiment, the base quencher is a tertiary amine where the nitrogen atom is not a member of an unsaturated heterocyclic compound or is not linked with a double bond to another atom.

Examples of preferred amine compounds that may be used as base quenchers comprise 2,8-dimethyl-6H,12H-5,11-methanodibenzo[b,f][1,5]diazocine (Troger's Base), ethyl-3-(morpholino)propionate, 4-(p-tolyl)morpholine, or a combination thereof.

In an embodiment, other base quenchers such as amido, pyridine, azole, primary and secondary amines are not used in the photoresist composition of this invention. In addition, strong amines that increase the pKa of the photoresist composition to greater than 7 are not used in order to prevent decomposition of the photoacid generator.

The amount of the base quencher in the photoresist layer is preferably from 0.001 to 1.0 wt %, more preferably from 0.01 to 0.8 wt % or from 0.02 to 0.2 wt % based on the total weight of solids in the photoresist composition.

The photoresist composition further comprises a solvent. The solvent is used to solvate the polymer and to facilitate miscibility of the various ingredients used in the composition.

Solvents generally suitable for dissolving, dispensing, and coating include anisole, alcohols including 1-methoxy-2-propanol (also referred to as propylene glycol methyl ether, PGME), and 1-ethoxy-2 propanol, esters including n-butyl acetate, 1-methoxy-2-propyl acetate (also referred to as propylene glycol methyl ether acetate, PGMEA), methoxyethyl propionate, ethoxyethyl propionate, ketones including cyclohexanone, 2,6-dimethyl-4-heptanone, 2 heptanone; ethyl lactate (EL), 2-hydroxyisobutyric acid methyl ester (HBM), gamma-butyrolactone (GBL), 3-methoxypropanoic acid methyl ester, and combinations thereof.

The solvent amount can be, for example, 20 to 95 wt %, preferably 40 to 80 wt %, and more preferably 50 to 70 wt %, based on the total weight of the photoresist composition. It will be understood that "polymer" used in this context of a component in the photoresist layer may mean only the polymers (that contain the acid labile group) disclosed herein. It will be understood that total solids include the polymer, photo destroyable base, quencher, surfactant, photoacid generator, and any optional additives, exclusive of solvent.

The photoresist composition can comprise other optional ingredients, such as one or more surface leveling agent (SLA), adhesion promoter and/or plasticizer. If used, the SLA is preferably present in an amount of from 0.001 to 0.1 wt % based on total solids of the photoresist composition, and if used, the adhesion promoter and/or plasticizer each are present in an amount of from 0.1 to 10 wt % based on total solids of the photoresist composition.

The photoresist composition is applied to the first metal layer 102 to form the photoresist layer 106. In an embodiment, the photoresist layer has a thickness of greater than 2 micrometers. The photoresist composition is generally applied upon a surface of the metal layer via spin-coating, dipping, roller-coating or some other conventional coating technique. Spin-coating is preferred. For spin-coating, the solids content of the coating solution can be adjusted to provide a desired film thickness based upon the specific coating equipment utilized, the viscosity of the solution, the speed of the coating tool and the amount of time allowed for spinning. In an embodiment, the photoresist composition is applied in a single application.

The photoresist composition layer is then patternwise exposed to activating radiation through a photomask to create a difference in solubility between exposed and unexposed regions. With reference to the FIG. 1B, after the deposition of the photoresist layer 106, a mask 110 is disposed on the photoresist layer 106 in order to photopattern the photoresist layer 106. A UV light having a wavelength of 10 to 500 nanometers may be used in the photopatterning. The exposed portions of the photoresist layer may be removed via etching with a suitable alkaline developer as seen in the FIG. 1C.

References herein to exposing a photoresist composition layer to radiation that is activating for the layer indicates that the radiation is capable of forming a latent image in the layer. The photomask has optically transparent and optically opaque regions corresponding to regions of the resist layer to be exposed and unexposed, respectively, by the activating radiation. The exposure wavelength is typically sub-500 nm, such as from 200 to 500 nm of UV-visible light. Preferably, the exposure is conducted with radiation of 365 nm wavelength from a mercury lamp (i-line).

Following exposure of the photoresist composition layer, a post exposure bake (PEB) is typically performed to decompose the acid labile group by acid that generated from the PAG during the exposure step. The PEB can be conducted, for example, on a hotplate or in an oven. A latent image defined by the boundary between polarity-switched and unswitched regions (corresponding to exposed and unexposed regions, respectively) is thereby formed.

The photoresist composition layer is next contacted with an alkaline developing solution to remove exposed portions of the layer, leaving unexposed regions forming a resist pattern. The developer is typically an aqueous alkaline developer, for example, a quaternary ammonium hydroxide solution, for example, a tetra-alkyl ammonium hydroxide solutions such as 0.26 Normality (N) (2.38 wt %) tetramethylammonium hydroxide (TMAH).

A further aspect is a process for depositing a metal on a metal layer 102. FIG. 1D is an exemplary depiction of the deposition of metal (via plating) 112 on the metal layer 102. The process includes immersing the metal layer in a metal plating solution and electro depositing a metal on the metal layer in the exposed portions of the photoresist composition layer. The metal layer 112 is typically formed on a substrate or on exposed portions of the first metal layer 102.

The substrate with the patterned photoresist layer 106 can be immersed in a metal plating solution to plate metal on the exposed first metal layer in those regions in which the photoresist composition layer has been developed away. The developed regions of the photoresist composition layer function as a mold for the metal plating. The metal can be plated, for example, by electroplating. Various types of metal plating solutions known in the art can be used. Also, two or more different layers of metal can be formed, and the layers can be of the same or different metals. Preferable plated metals include, but are not limited to, copper, nickel, tin, silver, gold and mixtures and alloys thereof. Suitable metal plating solutions for use in forming such metals are known in the art and are sourced from DuPont Electronics & Industrial. The thickness of the plated metal layer is typically from 1 to 100 micrometers, preferably from 5 to 50 micrometers. The plated metal layer thickness can be less than or exceed the thickness of the photoresist layer.

After metal plating, the remaining photoresist layer and underlayer can be removed (stripped) from the substrate to leave behind the plated metal structures 112. FIG. 1E depicts the plated metal structures 112 left behind after removal of the remaining photoresist layer. Suitable photoresist strippers are sourced from, for example, Shipley BPR™ Photostripper (DuPont Electronics & Industrial).

The exposed first metal layer between the plated metal structures can optionally be removed, for example, by etch-back process, to electrically isolate each of the plated metal structures. The obtained metal structures can have, for example, a line shape, which can be useful for re-distribution layer for providing electrical connection between two components. Advantageously, metal lines having small-width and straight (vertical) sidewalls can be formed by compositions and methods disclosed herein. Such structures find use, for example, in electrical connections in small, light and thin devices. The width of the lines can, for example, be from 0.8 to 10 micrometers, preferably from 1 to 3 micrometers. The height of the lines will depend, for example, on the thickness of the photoresist composition resin, but pillar heights of 2 micrometers or more can be formed.

This invention is advantageous in that the photoresist composition may be used to obtain lines with a larger cross-sectional area at the base when compared with the cross-sectional area at the top of the pillar. The use of the disclosed photoresist composition prevents the formation of an undercut at the bottom of the metal lines. This prevents crushing of the lines during further processing of the semiconductor.

The invention will now be exemplified by the following non-limiting examples.

EXAMPLES

The following examples are conducted to demonstrate the use of phosphonic acid in the photoresist compositions. The examples demonstrate how phosphonic acid may be used to minimize footing in the photoresist layer.

The photoresist composition comprises a polymer that comprises a first repeat unit having an acid labile group and a second repeat unit that comprises a hydroxystyrene. The polymers are shown in Table 1 below, where the amount of each repeat unit in the polymer is shown in mole percent. Three different polymers (A1, A2 and A3) were manufactured using different combinations of the repeat units displayed below.

The monomers shown in the Table 1 are TBA (tertiary butyl acrylate), ECPMA (ethylcyclopentyl methacrylate), STY (styrene) and PHS (polyhydroxystyrene). Structures for the monomers used in the polymer are shown below the Table 1.

TABLE 1

| Polymer Legend | TBA (mole %) | ECPMA (mole %) | STY (mole %) | PHS (mole %) | Mw (g/mole) |
|---|---|---|---|---|---|
| A1 | 35 | | | 65 | 23,000 |
| A2 | | 21 | 9 | 70 | 12,000 |
| A3 | 20 | | 10 | 70 | 21,000 |

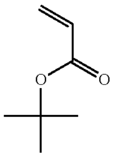

TBA

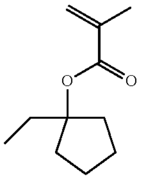

ECPMA

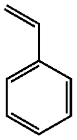

STY

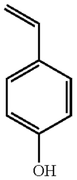

PHS

The photoacid generators (PAG) used are B1 (N-hydroxynaphthalimide trifluoromethanesulfonate, NHNI-TF) and B2 (N-hydroxynaphthalimide perfluoro-1-butanesulfonate, NHNI-PFBS) were sourced from Toyo Gosei Co. The structures are shown below.

B1

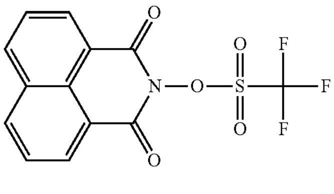

-continued

B2

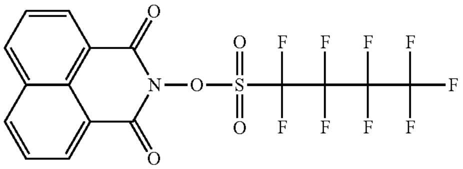

The acidic compounds (along with the predicted pKa) used in the respective photoresist compositions are shown in the Table 2. The pKa of the acidic compounds were obtained from SciFinder. The values in SciFinder have been calculated using Advanced Chemistry Development Software V11.02 (ACD/Labs). The pKa of organic compound has been traditionally measured by the potentiometric titration and capillary electrophoresis (CE).

The structures of the acids are shown below Table 3.

TABLE 2

| Acid Legend | Acid | pKa | Sourced from |
|---|---|---|---|
| C1 | phenyl phosphonic acid | 1.88 | WAKO |
| C2 | hexyl phosphonic acid | 2.66 | TCI |
| C3 | 2-ethylhexylphosphate | 1.93 | Aldrich |
| C4 | salicylic acid | 3.01 | TCI |
| C5 | benzenesulfonic acid hydrate | −0.60 | TCI |

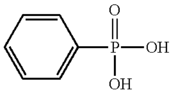

C1

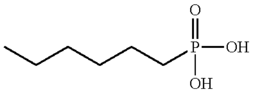

C2

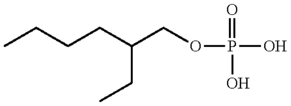

C3

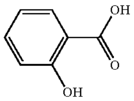

C4

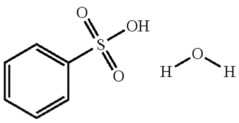

C5

The base quenchers used in the photoresist compositions used along with their predicted pKa's are shown in the Table 3. The pKa of compounds were obtained from SciFinder.

TABLE 3

| Quencher legend | Base Quenchers | pKa | Sourced from |
|---|---|---|---|
| D1 | Troger's Base | 4.53 | Aldrich |
| D2 | 4-morpholinepropanoic acid, ethyl ester | 6.60 | TCI |
| D3 | 4-(p-tolyl)morpholine | 5.71 | TCI |
| D4 | tBOC-4HP | 2.04 | TCI |
| D5 | nicotinamide | 3.54 | TCI |

TABLE 3-continued

| Quencher legend | Base Quenchers | pKa | Sourced from |
|---|---|---|---|
| D6 | N-allylcaprolactam | 0.50 | TGC |
| D7 | benzotriazole | 1.17 | Fujifilm WAKO |
| D8 | benzimidazole | 5.26 | Fujifilm WAKO |
| D9 | 3-pyridinepropanol | 5.4 | TCI |
| D10 | 4-morpholinoaniline | 6.72 | TCI |

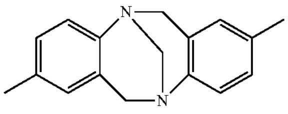

D1

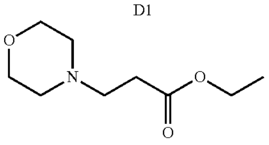

D2

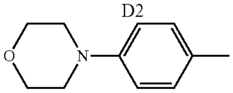

D3

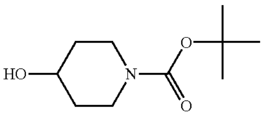

D4

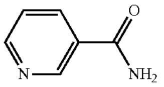

D5

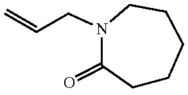

D6

TABLE 3-continued

| Quencher legend | Base Quenchers | pKa | Sourced from |
|---|---|---|---|

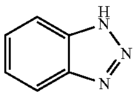

D7

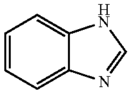

D8

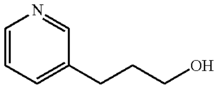

51

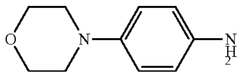

D10

The photoresist compositions comprising the polymer, the photoacid generator, the base quencher and the acid were mixed together and disposed on a metal layer disposed on a substrate. Table 4 shows formulation of photoresist examples and comparable examples. The PAG (B), acid (C), base (D) and SLA loading was adjusted as parts by weight against 100% of acid labile polymer (A). The solids content was adjusted to 34 wt %. PGMEA (propylene glycol 1-methyl ether 2-acetate) and GBL (γ-butyrolactone) were used as solvents. The ratio of PGMEA and GBL was adjusted to achieve a 98/2 weight ratio. The photoresist was filtered using a 0.45 μm polytetrafluoroethylene (PTFE) filter. Table 4 contains the examples that highlight the invention (denoted by EX) as well as comparative examples (denoted by CF).

TABLE 4

| Sample No. | Polymer 100 pbw | PAG | PAG loading [pbw] | Base | Base Loading [pbw] | Acid | Acid Loading [pbw] | Acid/Base (mol/mol) | SLA-1 [pbw] | PGMEA/GBL (weight ratio) | Solids (wt %) |
|---|---|---|---|---|---|---|---|---|---|---|---|
| CF-1 | A1 | B1 | 1.3 | D1 | 0.158 | C4 | 0.063 | 0.73 | 0.02 | 98/2 | 34 |
| EX-1 | A1 | B1 | 1.3 | D1 | 0.158 | C1 | 0.073 | 0.73 | 0.02 | 98/2 | 34 |
| CF-2 | A1 | B1 | 1.3 | D1 | 0.217 | None | | 0 | 0.02 | 98/2 | 34 |
| EX-2 | A1 | B1 | 1.3 | D1 | 0.217 | C1 | 0.077 | 0.57 | 0.02 | 98/2 | 34 |
| EX-3 | A1 | B1 | 1.3 | D1 | 0.217 | C1 | 0.107 | 0.78 | 0.02 | 98/2 | 34 |
| EX-4 | A1 | B1 | 1.3 | D1 | 0.217 | C1 | 0.137 | 1 | 0.02 | 98/2 | 34 |
| EX-5 | A1 | B1 | 1.3 | D1 | 0.217 | C2 | 0.081 | 0.57 | 0.02 | 98/2 | 34 |
| EX-6 | A1 | B1 | 1.3 | D1 | 0.217 | C2 | 0.113 | 0.78 | 0.02 | 98/2 | 34 |
| CF-3 | A1 | B1 | 1.3 | D1 | 0.217 | C3 | 0.103 | 0.57 | 0.02 | 98/2 | 34 |
| CF-4 | A1 | B1 | 1.3 | D1 | 0.217 | C3 | 0.142 | 0.78 | 0.02 | 98/2 | 34 |
| CF-5 | A1 | B1 | 1.3 | D1 | 0.217 | C3 | 0.182 | 1 | 0.02 | 98/2 | 34 |
| CF-6 | A1 | B1 | 1.3 | D1 | 0.217 | C5 | 0.086 | 0.57 | 0.02 | 98/2 | 34 |
| CF-7 | A1 | B1 | 1.3 | D1 | 0.217 | C5 | 0.119 | 0.78 | 0.02 | 98/2 | 34 |
| CF-8 | A1 | B1 | 1.3 | D1 | 0.217 | C5 | 0.153 | 1 | 0.02 | 98/2 | 34 |
| EX-8 | A1 | B1 | 1.3 | D2 | 0.162 | C1 | 0.077 | 0.57 | 0.02 | 98/2 | 34 |
| EX-9 | A1 | B1 | 1.3 | D2 | 0.162 | C1 | 0.107 | 0.78 | 0.02 | 98/2 | 34 |
| EX-10 | A1 | B1 | 1.3 | D2 | 0.162 | C1 | 0.137 | 1 | 0.02 | 98/2 | 34 |
| EX-11 | A1 | B1 | 1.3 | D3 | 0.154 | C1 | 0.077 | 0.57 | 0.02 | 98/2 | 34 |
| EX-12 | A1 | B1 | 1.3 | D3 | 0.154 | C1 | 0.137 | 1 | 0.02 | 98/2 | 34 |
| EX-13 | A1 | B1 | 1.3 | D3 | 0.154 | C1 | 0.167 | 1.22 | 0.02 | 98/2 | 34 |
| EX-14 | A1 | B1 | 1.3 | D3 | 0.154 | C1 | 0.190 | 1.39 | 0.02 | 98/2 | 34 |
| CF-9 | A1 | B1 | 1.3 | D4 | 0.174 | C1 | 0.077 | 0.57 | 0.02 | 98/2 | 34 |
| CF-10 | A1 | B1 | 1.3 | D4 | 0.174 | C1 | 0.107 | 0.78 | 0.02 | 98/2 | 34 |
| CF-11 | A1 | B1 | 1.3 | D4 | 0.174 | C1 | 0.137 | 1 | 0.02 | 98/2 | 34 |
| CF-12 | A1 | B1 | 1.3 | D5 | 0.106 | C1 | 0.137 | 1 | 0.02 | 98/2 | 34 |

TABLE 4-continued

| Sample No. | Polymer 100 pbw | PAG | PAG loading [pbw] | Base | Base Loading [pbw] | Acid | Acid Loading [pbw] | Acid/ Base (mol/ mol) | SLA-1 [pbw] | PGMEA/ GBL (weight ratio) | Solids (wt %) |
|---|---|---|---|---|---|---|---|---|---|---|---|
| CF-13 | A1 | B1 | 1.3 | D5 | 0.106 | C1 | 0.167 | 1.22 | 0.02 | 98/2 | 34 |
| CF-14 | A1 | B1 | 1.3 | D5 | 0.106 | C1 | 0.190 | 1.39 | 0.02 | 98/2 | 34 |
| CF-22 | A1 | B1 | 1.3 | D6 | 0.133 | C1 | 0.137 | 1 | 0.02 | 98/2 | 34 |
| CF-21 | A1 | B1 | 1.3 | D7 | 0.103 | C1 | 0.137 | 1 | 0.02 | 98/2 | 34 |
| CF-20 | A1 | B1 | 1.3 | D8 | 0.102 | C1 | 0.137 | 1 | 0.02 | 98/2 | 34 |
| CF-15 | A1 | B1 | 1.3 | D9 | 0.119 | C1 | 0.137 | 1 | 0.02 | 98/2 | 34 |
| CF-19 | A1 | B1 | 1.3 | D10 | 0.154 | C1 | 0.137 | 1 | 0.02 | 98/2 | 34 |
| EX-15 | A1 | B2 | 1.9 | D1 | 0.217 | C1 | 0.137 | 1 | 0.02 | 98/2 | 34 |

Pretreatment of Copper Substrate

A copper metal layer is deposited by plasma vapor deposition on a silicon substrate to form a copper wafer. Prior to the copper deposition, a titanium metal layer is deposited on the silicon substrate for passivation and to facilitate adhesion of the photoresist layer to the substrate. The copper wafer was dipped in 10 wt % of sulfuric acid ($H_2SO_4$) for 30 seconds followed by rinsing in deionized water and drying in a nitrogen atmosphere, performing a 60 second puddle with a 2.38 wt % TMAH developer, spin drying, rinsing in deionized water and spin drying. After the spin-drying, heating processes such as dehydration bake and/or a coating with a HMDS primer are not performed/applied to the copper wafer.

Process Conditions

The process conditions are as follows:

Substrate: Surface—copper/titanium/silicon

Primer: None applied

Standard bake (S.B.) was performed at 135° C./90 sec

Film thickness of photoresist layer is 8 micrometers (μm).

Exposure: NSR-2005i9C, 0.50 numerical aperture (NA)/0.68 PC

Post exposure bake (PEB) was performed at 110° C./90 sec

Developer: MF® CD-26, 2.38 wt % TMAH, 80 sec, single puddle

Pattern Profile Evaluation

Pattern profile of the photoresist layer was evaluated at an exposure energy that enables 1.5 micrometers (μm) of space width at the focus center ($E_{op}$). A closeup cross section image at the bottom of 1.5 μm isolated trench pattern the focus center of the 1.5 μm dense trench pattern was also evaluated.

FIG. 2 depicts Table 5 which shows the effect of the acidic compound addition to the pattern profile. By adding acidic compound C1 (phenyl phosphonic acid), the footing profile seen in comparative example CF-2 (which contains no acid) may be eliminated (as may be seen in the photomicrograph of EX-1) in the FIG. 2. However, it is uncertain whether this effect of the salicyclic acid is due to its acid strength or not. (Phenyl phosphonic acid (C1) has a stronger acidity (i.e., a lower pKa) than salicyclic acid (C4)). FIG. 2 depicts a comparison of a cross section pattern profile under different acids. The profile at the bottom of 1.5 μm isolated trench was compared. This footing profile effect is not obtained when compound C4 (salicylic acid) is added to the photoresist composition.

Pattern profile tends to include under-cutting and overhanging by increasing the loading of compounds C1 or C2 (which are phosphonic acids). However, this effect is not observed when C3 (ethylhexylphosphate) or C5 (benzenesulfonic acid hydrate) was used as acids in the photoresist composition. From these results it may be deduced that the effect of acidic compound addition is not dependent upon its strength but may be due to its specific chemical structure. It may also be seen that the phosphate (C3) does not reduce footing on copper while phosphonic acid (C1 and C2) reduces footing and creates an undercut by controlling the amount of loading.

FIG. 3 (which depicts Table 6) shows a comparison of the effect of acidic compounds on the cross section pattern profile. In particular, the profile at the bottom of the 1.5 μm isolated trenches is compared for different acids (C1, C2, C3 and C5). The pattern profile tends to have an undercut or overhang when compounds C1 or C2 were used in the photoresist composition in larger quantities (compare 57% with either 78% and 100%). However, this effect is not observed when C3 or C5 is used as the acid. From this test result, it may be concluded that the effects of acidic compound addition may not be estimated solely by the acid strength. Without being limited to theory, it is caused by specific chemical structure. It may be seen that phosphate (C3) does not reduce footing on copper while phosphonic acid (C1 and C2) reduces footing and creates an undercut by controlling its loading amount.

FIG. 4 (which depicts Table 7) shows the effect of the different base quenchers on pattern profile while simultaneously using different loadings of the acidic compound C1 (phenyl phosphonic acid). As in the previous table (Table 6 depicted in the FIG. 3), the profile at the bottom of 1.5 μm isolated trench is observed. Adding higher amounts of the acidic compounds tends to give an undercut or overhung profile on copper when base quenchers (D1, D3 or D2) were used. However, when D4 (tBOC-4HP) or D5 (nicotine amide) is sued in conjunction with the acidic compound C1, the footing profile was not improved.

FIG. 5 (which depicts Table 8) and FIG. 6 (which depicts Table 9) shows the effect of the different base quencher-acidic compound combinations to the pattern profile. From these figures it may be seen that the combination of acidic compound C1 with one of the base quenchers D1, D10 or D2 (in the photoresist composition) reduces the presence of footing. Combinations of C1 with one of D4, D6, D7, D5, D8 and D9 shows the presence of substantial footing. From these test results, the effect of acidic compound (C) and base quencher (D) is determined by the strength of the base quencher (pKa). Combinations of D10 with C1 in the photoresist compositions produced a white precipitation after mixing. As a follow up experiment, the precipitation was observed by mixing 1 wt % PGMEA solution of D10 and C1 at the same molar amount. Formation of an acid-base salt or complex is one possible reason for the precipitation. Precipitation may be caused by solubility of the salt in the photoresist solvent (PGMEA/GBL=98/2).

FIG. 7 (which depicts Table 10) depicts the effect of the different PAGs (B1 and B2) on the photoresist composition when using a combination of the acidic compound C1 with the base quencher D1. Either B1 or B2 PAG results in an undercut profile using the acid-base combination of C1 with D1.

Without being limited to theory, it is believed that the phosphonic acids form a monolayer on a metal oxide formed on the metal (in this case the copper layer disposed on the substrate). The acid is believed to covalently bond to the metal oxide thus serving as a corrosion inhibitor. Copper corrosion may occur via ionization, migration and oxidation. If any one of these methods of copper corrosion can be stopped then the corrosion will not proceed. When a covalent bond is formed between phenyl phosphonic acid and the metal oxide (CuO), the copper ions may not migrate to the CuO and hence maintain a certain concentration. The passivation of the coper oxide surface by the phosphonic acid prevents further metal ionization, which reduces photoacid consumption by the metal ionization. This reduction in photoacid consumption prevents the presence of large amounts of footing on metal (e.g., copper) substrates. However, it is to be noted that the phosphonic acid is preferably added in an amount effective to reduce ionization. Excess amounts of phosphonic acid may act as free acid which facilitate pattern collapse and the formation of an overhung pattern profile.

What is claimed is:

1. A metallization method, comprising:

(a) providing a photoresist layer on a first surface of a substrate, wherein the photoresist layer is formed from a photoresist composition comprising: a polymer comprising acid-labile groups; a photoacid generator; an organic phosphonic acid; a solvent; and a basic compound;

(b) pattern-wise exposing the photoresist layer to activating radiation;

(c) developing the exposed photoresist layer with a basic developer to form a photoresist pattern; and (d) after forming the photoresist pattern, plating a metal on the first surface of the substrate using the photoresist pattern as a plating mask, wherein the organic phosphonic acid is selected from the group consisting of butyl phosphonic acid, pentyl phosphonic acid, hexyl phosphonic acid, octyl phosphonic acid, n-decyl phosphonic acid, n-dodecylphosphonic acid, n-hexadecylphosphonic acid, n-hexylphosphonic acid, n-octadecylphosphonic acid, n-octylphosphonic acid, n-tetradecylphosphonic acid, phenyl phosphonic acid, benzylphosphonic acid, (4-aminobenzyl) phosphonic acid (4-aminophenyl) phosphonic acid, (4-hydroxyphenyl) phosphonic acid, benzhydryl phosphonic acid, (2-phenylethyl) phosphonic acid, 4-methoxyphenyl phosphonic acid, (pyridin-3-ylmethyl) phosphonic acid, or a combination thereof, and wherein the basic compound is selected from the group consisting of 2,8-dimethyl-6H,12H-5,11-methanodibenzo [b,f][1,5]diazocine (Troger's Base), ethyl-3-(morpholino) propionate, 4-(p-tolyl) morpholine, or a combination thereof.

2. The metallization method of claim 1, wherein the photoresist pattern has an undercut profile.

3. The metallization method of claim 1, further comprising (e) removing the photoresist pattern after plating the metal.

4. The metallization method of claim 1, wherein the photoresist layer is disposed directly on a metal layer.

5. The metallization method of claim 1, wherein the photoresist layer has a thickness of greater than 2 microns.

6. The metallization method of claim 1, wherein the organic phosphonic acid is a phenyl phosphonic acid.

7. The metallization method of claim 1, wherein the organic phosphonic acid is present in the photoresist layer in an amount of 0.01 to 0.50 parts by weight per 100 parts of the polymer that comprises acid-labile groups.

8. The metallization method of claim 1, wherein the acid-labile groups are chosen from tertiary ester groups, acetal groups, or a combination thereof.

9. The metallization method of claim 1, wherein the polymer further comprises a repeat unit formed from a vinyl aromatic monomer.

10. The metallization method of claim 1, wherein the photoresist composition further comprises a basic compound having a pKa of less than 7.

11. The metallization method of claim 10, wherein the basic compound is selected from tertiary amine compounds.

* * * * *